United States Patent [19]
Terabayashi et al.

[11] Patent Number: 5,414,239
[45] Date of Patent: May 9, 1995

[54] OPTICAL APPARATUS FOR LASER MACHINING

[75] Inventors: Takao Terabayashi; Hidemi Sato; Hideaki Tanaka, all of Yokohama; Yoshitada Oshida, Fujisawa, all of Japan

[73] Assignee: Hitachi, Ltd., Tokyo, Japan

[21] Appl. No.: 24,643

[22] Filed: Mar. 1, 1993

[30] Foreign Application Priority Data

Mar. 18, 1992 [JP] Japan .................................. 4-062077

[51] Int. Cl.6 .............................................. B23K 26/06
[52] U.S. Cl. ........................... 219/121.73; 219/121.67; 219/121.75; 219/121.8; 219/121.84
[58] Field of Search ...................... 219/121.73, 121.74, 219/121.75, 121.76, 121.77, 121.8, 121.84, 121.68, 121.69, 121.7, 121.71; 250/234

[56] References Cited

U.S. PATENT DOCUMENTS

| 4,001,840 | 1/1977 | Becker et al. | 219/121.75 |
| 4,455,485 | 6/1984 | Hosaka et al. | 250/234 |
| 4,508,749 | 4/1985 | Brannon et al. | |

FOREIGN PATENT DOCUMENTS 2-015887  1/1990  Japan .

OTHER PUBLICATIONS

Poulin, G. Darcy, et al. "A Versatile Excimer Laser Processing System," SPIE, vol. 998, Excimer Beam Applications, Dec. 1988, pp. 17-23, (English).
Bachmann, F. "Excimer Lasers in a Fabrication Line for a Highly Integrated Printed Circuit Board," Chemtronics, vol. 4, Sep. 1989, pp. 149-152, (English).
Brannon, James H. "Micropatterning of Surfaces by Excimer Laser Projection," J. Vac. Sci. Technol. B 7 (5), Sep./Oct. 1989, pp. 1064-1071 (English).
Taniguchi, Hiroshi, et al. "Application of Excimer Laser to Machining of Printed Circuit Board," Oct. 1991, pp. 120-125 (Japanese).

*Primary Examiner*—Geoffrey S. Evans
*Attorney, Agent, or Firm*—Fay, Sharpe, Beall, Beall, Minnich & McKee

[57] ABSTRACT

A laser-machining optical apparatus designed to efficiently work an object through a large area thereof by projecting an image of a mask to the object through a laser beam having a small sectional area and a high energy density. The apparatus has a laser head for oscillating laser light for working the specimen, a mask provided in the optical path of the laser light beam between the specimen and the laser head and having a working pattern formed on its surface, an objective provided in the optical path of the laser-light beam between the mask and the specimen, a mechanism on which the mask and the specimen are placed so that an optical imaging relationship is maintained therebetween with the objective interposed therebetween, and a two-dimensional scanning device provided in the optical path of the laser light beam between the laser head and the mask to two-dimensionally scan the surface of the mask with the laser light beam from the laser head.

23 Claims, 15 Drawing Sheets

FIG. IA
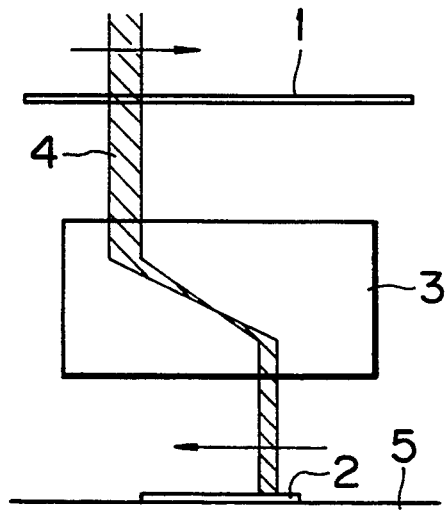
FIG. IB
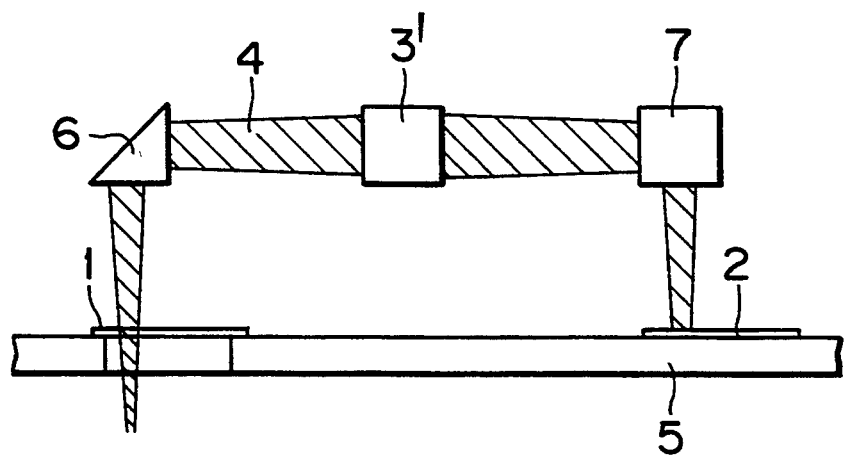

OPTICAL APPARATUS FOR LASER MACHINING

BACKGROUND OF THE INVENTION

This invention relates to a laser-machining optical apparatus for working, by using convergent laser light in high energy density, an object having a worked area greater than the size of a cross-section of the laser light at a high efficiency.

As one of the methods most generally used to remove or work an object by utilizing energy of laser light, a method is known which is based on removing the material of a specimen by a thermal or chemical action caused by irradiating a specimen surface with a laser light beam which is converged to increase the energy density. A method, such as that disclosed on pages 17 to 23 of SPIE, Vol. 988 (1988), is also known in which an image of a mask having a working pattern formed on its surface is projected onto a surface of a specimen so that a surface region thereof having an area corresponding to the sectional area of a laser beam or an area defined by optically enlarging or reducing the sectional area of the laser beam can be worked at one time. There is also a method in which a large area of an image of a working pattern on a mask is collectively projected to an object formed of a material reactive with light through a laser light beam having an increased sectional area. This effect may be achieved by excimer laser exposure. Ordinarily, in the case of working an object formed of a material non-reactive with light by laser energy, there is a threshold value of the energy density at which the material can be removed. Accordingly, in the method of removing the material of an object by using the abovementioned mask, if the transverse sectional area of the laser beam is increased to set a large area through which the object can be worked at one time, the energy density may be so low that the object cannot be worked. Naturally, there is a limit of the increase in the beam area. For this reason, in the case of applying the method of working a specimen by projecting a pattern on a mask to the specimen surface to a process using a large-area working pattern, it is a common practice to use a step-and-repeat process in which a local region of the specimen is worked with a small-area laser beam and the mask and the specimen is thereafter moved to work another region. Conventionally, a method of moving the laser beam or moving the mask and the specimen relative to the laser beam is not used in such a case.

On the other hand, as a method of working an object by projecting a large-area working pattern through a laser beam, a method, such as that described on pages 149 to 152 of CHEMITRONICS, Vol. 4 (1989.9), is known in which a thin-film metal mask is formed on a surface of a specimen by photochemical exposure, the specimen is moved while the specimen surface with the mask is irradiated with a convergent laser beam to work the material, and the mask is thereafter removed by being chemically etched.

The above-described conventional methods achieve a high working efficiency but require a long total processing time through the entire process, because of the need for a photochemical exposure step for forming the mask. They also entail the risk of damage to the mask because the mask is irradiated with the laser beam having the same energy density as that required for removing the material.

SUMMARY OF THE INVENTION

In view of the above-described problems, an object of the present invention is to provide a laser-machining optical apparatus capable of efficiently working a surface of a specimen by using a laser light beam of a high energy density and by projecting a large area of a working pattern formed on a mask onto the specimen surface.

To achieve this object, according to the present invention, there is provided a laser-machining optical apparatus comprising a laser head for oscillating laser light for working a specimen, a mask provided in the optical path of a beam of the laser light between the specimen and the laser head and having a working pattern formed on its surface, an objective provided in the optical path of the laser light beam between the mask and the specimen, a mechanism on which the mask and the specimen are placed so that an Optical imaging relationship is maintained between the mask and the specimen with the objective interposed therebetween, and two-dimensional scanning means provided in the optical path of the laser light beam between the laser head and the mask to two-dimensionally scan the surface of the mask with the laser light beam from the laser head.

BRIEF DESCRIPTION OF THE DRAWINGS

FIGS. 1A and 1B are diagrams showing basic concepts of a laser-machining optical apparatus which scans a mask and a specimen surface with a laser beam;

DESCRIPTION OF THE PREFERRED EMBODIMENTS

Figure 2:
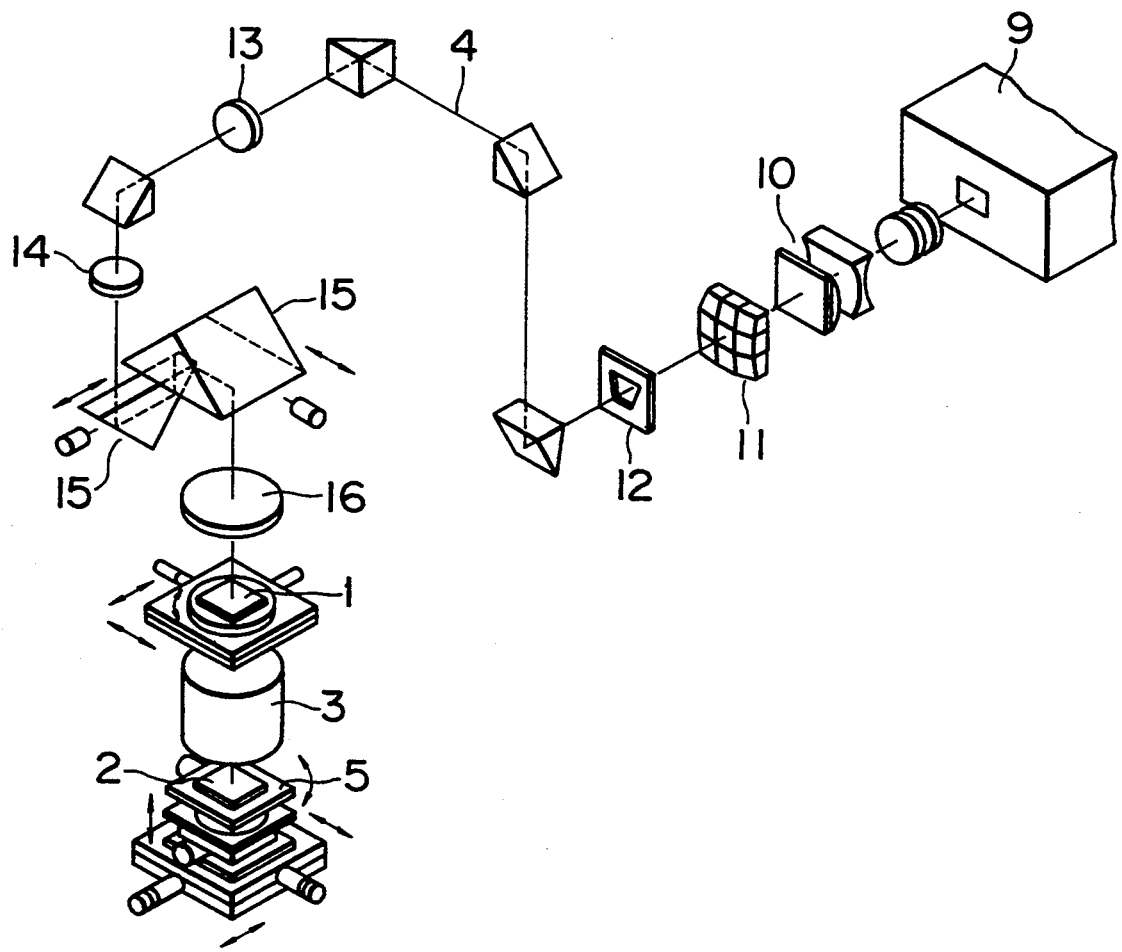
FIG. 2 is a diagram of a laser-machining optical apparatus in accordance with an embodiment of the present invention.

FIGS. 1A and 1B show basic concepts of the present invention. FIG. 1A shows a basic layout of an optical system for working a large-area region of a specimen 2 in such a manner that a beam of laser light is moved to scan the specimen 2 while a mask 1 and the specimen 2 are fixed, and FIG. 1B shows a layout of an optical system for working a large-area region of a specimen 2 in such a manner that the specimen 2 and a mask 1 are moved to be scanned while a beam of laser light is fixed. A working pattern is formed on each mask 1. A component 3 is an objective for projecting an image of the working pattern on the mask to a surface of the specimen 2. A hatched area 4 represents each beam of laser light. A component 5 is a specimen table, a component 6 is a prims or a mirror for changing the direction of the beam of introduced laser light, a component 7 is a conversion optical system for changing the direction of the beam of laser light coming out from an objective indicated at 3' and for setting the orientation of the mask image projected onto the specimen surface in accordance with the orientation of the mask. The objective 3' serves to project an image of the working pattern on the mask to the specimen surface at a magnification ratio of 1:1.

In the system shown in FIG. 1A, the mask 1 and the specimen 2 are positioned and, thereafter, the beam of laser light 4 introduced perpendicularly to the mask 1 and parallel to the optical axis of the objective 3 is moved by a drive system separately provided so as to scan the mask surface, as indicated by the arrow, for example. The working pattern on the mask surface is thereby projected to the specimen surface.

In the system shown in FIG. 1B, the mask 1 and the specimen 2 are placed on the same specimen table 5. When laser light 4 passes through the prism 6 and the objective 3' after passing through the mask 1, an inversion or a reversal of the image occur. If the conversion optical system 7 is arranged to correct the changed state of the image so that the image is projected to the specimen surface with the same orientation as the original pattern on the mask, and if the objective 3' is a 1:1 projection lens, the working pattern on the surface of the mask 1 can be suitably projected onto the surface of the specimen 2 by a scanning operation of moving the specimen table 5 with a drive system separately provided while fixing the beam 4.

FIG. 2 shows a laser-machining optical apparatus having a combination of a double telecentric optical system with a large field and prisms and using excimer laser light, whereby a working pattern image on a mask 1 is projected to a large area on a surface of a specimen 2 to work the specimen 2. As illustrated, this apparatus has a double telecentric objective 3, a laser head 9, a beam expansion system 10, a beam splitting polyhedron prism 11, an aperture 12, a condenser lens 13, a telecentric lens 14, combination prisms 15, and an incident angle correction lens 16.

A beam of excimer laser light 4 coming out from the laser head 9 and having a rectangular cross section is expanded and shaped by the beam expansion system 10 so as to have a square cross section, and passes through the polyhedron prism 11, the aperture 12, the condenser lens 13 and the telecentric lens 14 to reach the combination lens 15. The laser light 4 coming out from the combination prism 15 passes through the incident angle correction lens 16 and reaches the mask 1 having a surface on which the working pattern is formed. At this time, the aperture 12 is imaged on the mask 1 by the condenser lens 13. An area of the mask 1 corresponding to the size of the image of the aperture 12 thereby formed on the mask 1 is projected to the surface of the specimen 2 by the double telecentric objective 3. In this embodiment, the projection magnification ratio is 1:1. The telecentric lens 14 is provided for the purpose of making the laser light from the condenser lens 13 parallel. Incident light and emergent light with respect to the double telecentric objective 3 are, in principle, parallel to the optical axis thereof. However, with a shift of the laser beam from the lens center to a peripheral position, an image distortion due to an aberration is increased and the resolution is reduced, that is, the projection accuracy deteriorates, since the aperture of the objective 3 is large. There is a need to limit the reduction in the projection accuracy. Therefore, the incident angle correction lens 16 is used to cancel the reduction in the projection accuracy by gradually inclining the laser beam little by little relative to the optical axis with respect to the laser beam position in the radial direction from the center toward the circumference of the lens. In the above-described optical system, the combination prisms 15, disposed so that their diagonal surfaces oppose orthogonally to each other, are respectively moved in directions perpendicular to each other to scan the surface of the mask 1 with the laser beam 4. The specimen 2 is thereby worked in accordance with the same pattern as that on the mask 1. An advantage of using the rectangular prisms as described above resides in that the distance through which each prism is moved is only half the distance through which the mask pattern is to be scanned.

An object of the polyhedron prism 11 in the present invention is to prevent the objective 3 from being damaged by condensation of laser light 4 in the objective 3. The principle of this effect will be described below by taking a nine-face prism.

Figure 3:
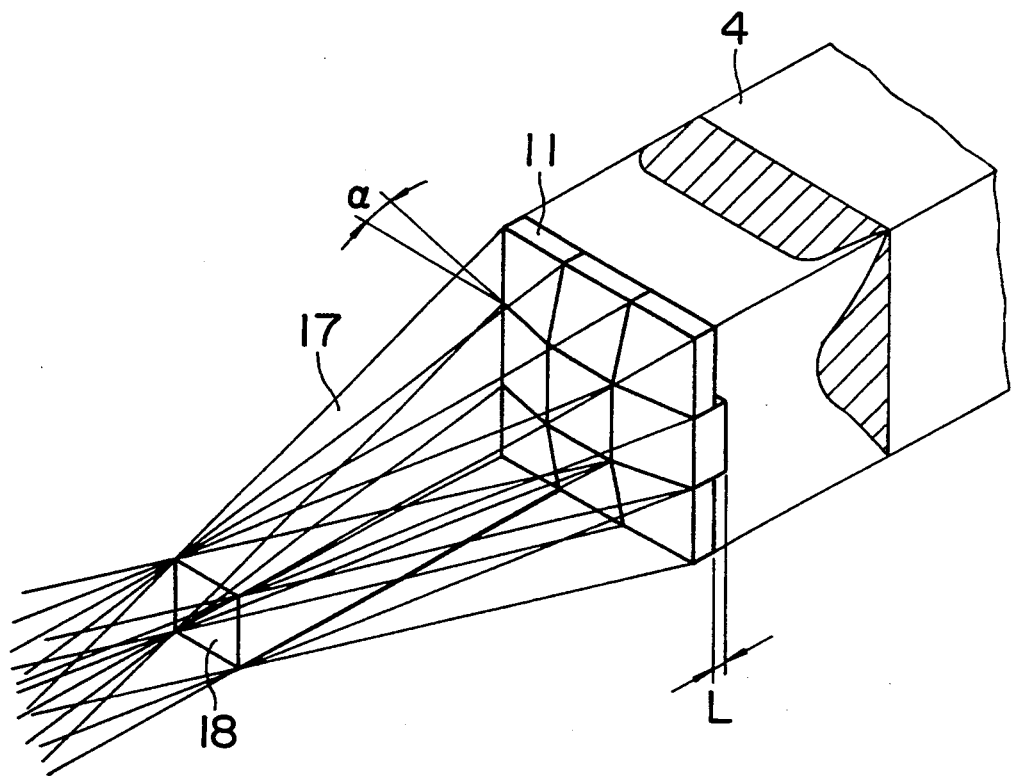
FIG. 3 is a diagram of a beam-splitting nine-face prism in accordance with the embodiment.
Figure 4:
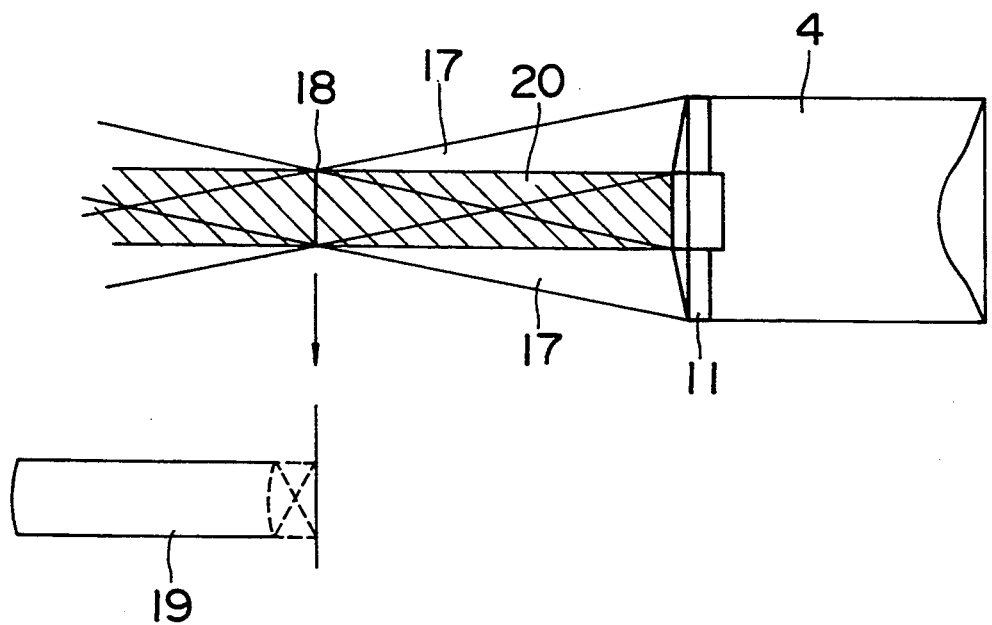
FIG. 4 is a diagram showing superposition of laser light beams split by the nine-face prism and an energy density distribution at the superposition point.
Figure 5:
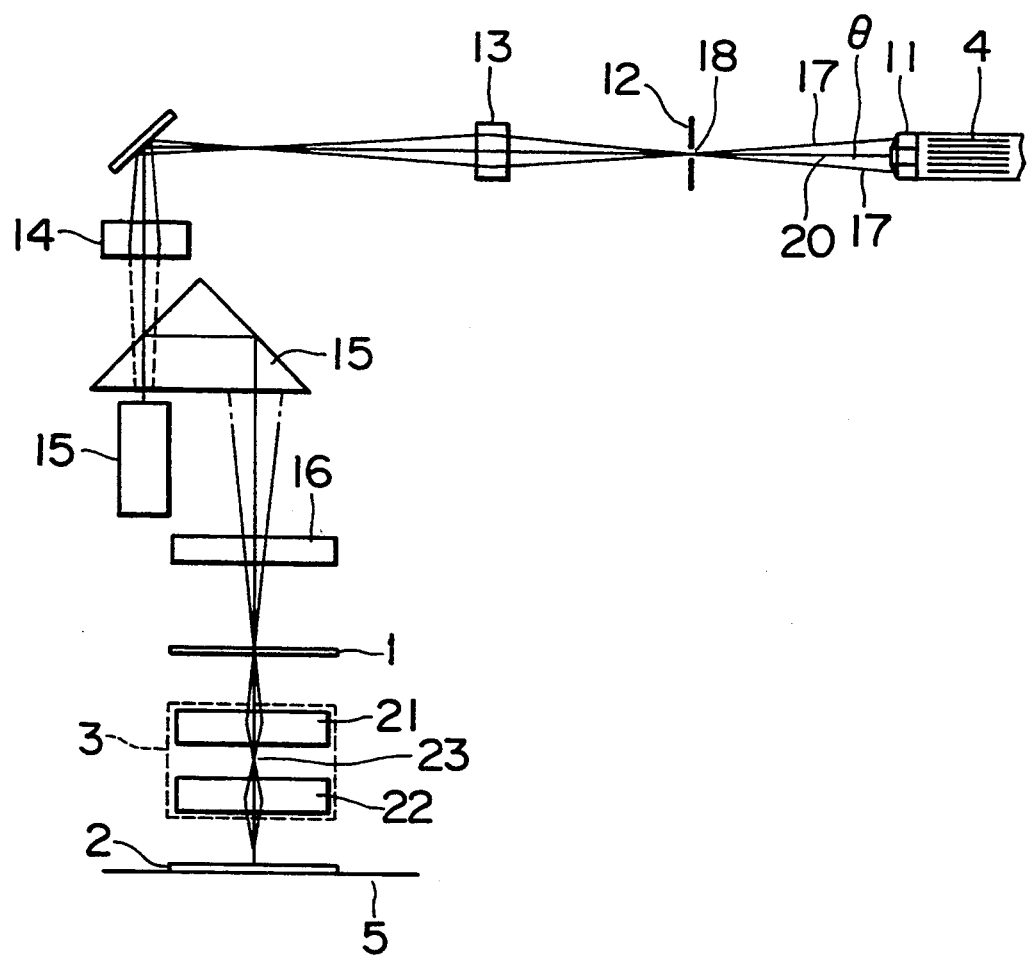
FIG. 5 is a schematic diagram of the optical path of the split laser beams and of the principle of the effect of preventing damage to an objective even when the laser light energy density in the objective is increased.
Figure 6:
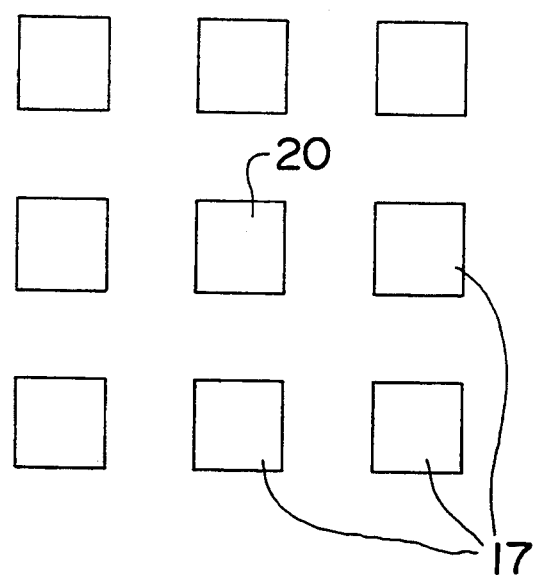
FIG. 6 is a diagram of the state of laser light at the surface of the objective.

FIG. 3 shows the shape of the beam splitting nine-face prism used in this embodiment and a split state of laser light. The nine-face prism is a polyhedron prism having nine faces and formed in such a manner that nine blocks square in section, having end surfaces corresponding to the nine faces of the nine-face prism and having lengths slightly different from each other are integrally combined so that the end surfaces form the back faces of the polyhedron prism. FIG. 4 shows an energy density distribution 19 in a cross section of laser beams superposed after being split by the nine-face prism, and FIG. 5 schematically shows the optical path of the split laser beams. FIG. 6 shows the placement of the split laser beams on the lens surface.

In these figures, split laser beams are indicated at 17, and a point at which the laser beams are superposed after being split is indicated at 18. A main beam among the split light beams is indicated at 20, lens elements constituting the double telecentric objective 3 are indicated by 21 and 22, and a condensation point at which the laser beams are condensed is indicated at 23. In FIG. 5, the split laser beams are each indicated by a line for convenience of drawing.

Referring to FIG. 5, the nine beams 17 of the laser light 4 split by the nine-face prism 11 travel each at a predetermined angle, are superposed at the point 18, and further travel by separating from each other. The state of this superposition is illustrated in FIG. 3. The laser light 4 is split into three equal beams as viewed in a direction toward each side of the prism 11, and the split beams other than the main beam 20 are combined with the main beam 20 by being inverted. An advantageous effect is thereby achieved such that the energy density at the superposition point 18 is higher than that before the splitting, and the distribution uniformity is improved at the superposition point 18, as indicated at 19 in FIG. 4. The basic concept of the optical system shown in FIGS. 1 and 5 resides in that the aperture 12 is provided at the superposition point 18, the aperture 12 is imaged on the mask 1 by the condenser lens 13, and the aperture image on the mask 1 is projected to the specimen surface by the objective 3.

Ordinarily, the double telecentric objective 3 has a structure such as to be separated into two parts about a center on the lens optical axis. The laser light is most convergent at the point located at the center of the two parts. For example, the objective 3 of a projection magnification ratio of 1:1 in accordance with this embodiment is separated into lens elements 21 and 22 which are symmetrical about a plane containing a center 23 on the lens optical axis. Accordingly, the energy density on the surfaces of the lens elements 21 and 22 is highest on the convergent point 23 side. If the lens system is arranged to increase the energy density at the surface of the specimen 2, the energy density on the lens surfaces is necessarily increased, which may cause damage to the lens. The nine-face prism 11 serves to reduce the density of energy to the lens to 1/9, for example, by splitting the incident laser light into nine beams at the lens, as shown in FIG. 6, to ensure that the lens is not easily damaged even if the energy density at the surface of the specimen 2 is increased.

The method of obtaining this effect resides in arranging the optical system so that the split beams of the laser light incident upon the mask 1 other than the main beam has a suitable angle $\theta$ from the main beam such as to be superposed on the optical path and thereafter separated from each other, and so that the separated beams are superposed again at the surface of the mask 1 as as to form one beam, as shown in FIG. 5.

The angle $\theta$ is selected in a range such that the split means 17 are completely separated at the surfaces of the lens elements 21 and 23 of the objective 3 on the condensation point 23 side, and such that the projection accuracy at the time of superposition at the specimen surface after this separation is not influenced by splitting.

The value of $\theta$ is determined from an inclination $\alpha$ of the prism surface from the cross section of the laser beam shown in FIG. 3 and the magnifying power of the objective 13.

The length of a central portion of the nine-face prism is increased by L as shown in FIG. 3 to change the optical length thereof, because, in a direction in which the energy density distribution of the excimer laser light has a Gaussian profile, interference of light may occur due to spatial coherency of the laser light to cause a deterioration in projection accuracy.

Figure 7:
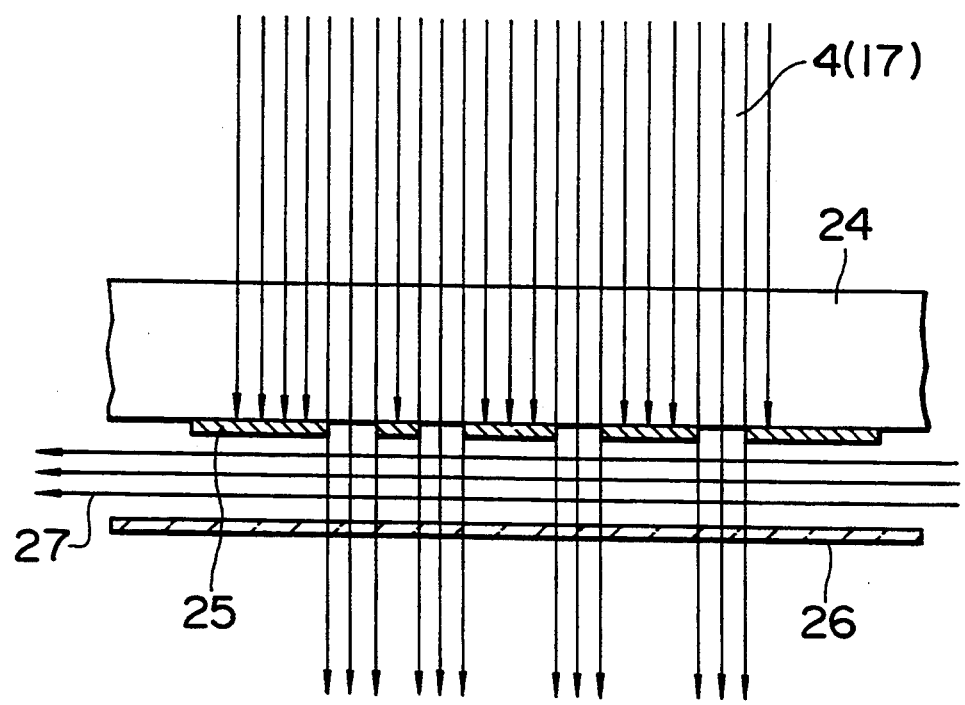
FIG. 7 is a diagram of the structure of a mask.

The effect of the above-described nine-face prism 11 will be described below quantitatively. Referring to FIG. 5, the excimer laser beam 4 having a wavelength of 248 nm, coming out from the laser head and previously shaped so as to have a 21 mm-square cross section, is split into beams each having 7 mm-square cross section by the nine-face prism 11 formed of synthetic silica glass. These split beams are superposed at the point 18 so that the superposed beam has a 7 mm-square size. The image at the superposition point is imaged as a 4 mm-square image on the surface of the mask 1 by the condenser lens 13, and this mask image is projected as a 4 mm-square image on the surface of the specimen 2 by the double telecentric objective 3. For example, if an energy density of 0.5 J/cm$^2$ at the surface of the specimen 2 is required, the energy density at the surface of the mask 1 is set to 0.5 J/cm$^2$ since the projection magnification ratio of the optical system of this embodiment is 1:1. Then, the laser beam has its size reduced to ¼ at the surfaces of the lens elements 21 and 22 and the energy density at both surfaces is about 8 J/cm$^2$ if the beam splitting system is not used. In such a situation, the lens elements 21 and 22, which can ordinarily be damaged at about 3 J/cm$^2$, cannot be used. Under these conditions, the energy density at this point could be reduced to about 0.9 J/cm$^2$ by setting the angle $\theta$ of incidence of the laser beam upon the mask 1 to 1 degree (nine-face prism surface angle $\alpha = 1.143°$), Ordinarily, the working pattern formed on the surface of the mask 1 is formed by, for example, depositing a metal such as chromium. However, there is a strong risk that the working pattern formed in this manner will be damaged if the energy density applied to the mask is high as in the case of excimer laser removal machining. In accordance with this embodiment, a mask having high durability against laser power could be manufactured by forming a reflecting film of a dielectric on a synthetic fused silica. Further, to void a deterioration in the pattern dimension accuracy due to absorption of small amount of laser energy, the mask was cooled by a method as shown in FIG. 7. In FIG. 7 are illustrated a synthetic silica glass substrate 24, a working pattern 25 formed of a reflecting dielectric film, a cover glass 26, and a flow of a cooling gas 27.

Figure 8:
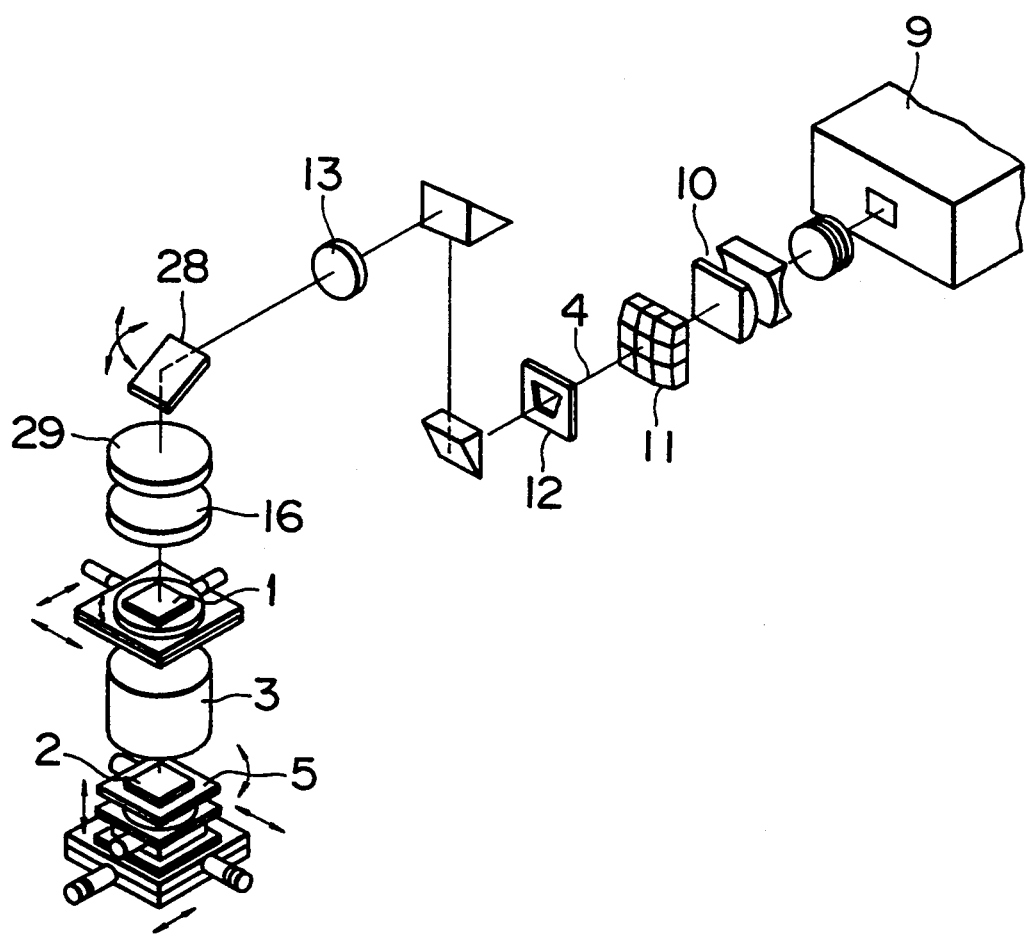
FIG. 8 is a diagram of a laser-machining optical apparatus using a Galvanomirror.

FIG. 8 shows a laser-machining optical apparatus in which a Galvanomirror 28 is used in plate of the combination prisms shown in FIG. 2. This apparatus works an object by scanning the same with a laser beam 4 by using the Galvanomirror 28. The Galvanomirror 28 serves to move the laser beam for scanning along two axes. A component 29 shown in FIG. 8 is an optical element for correcting a deterioration in imaging performance and the rotation of the laser beam 4 caused by a change in optical path length when the laser beam 4 is moved for two-dimensional scanning by using the Galvanomirror 28. This embodiment is the same as the laser-machining optical apparatus shown in FIG. 2 except that the arrangement for scanning with the laser beam is different.

Figure 9:
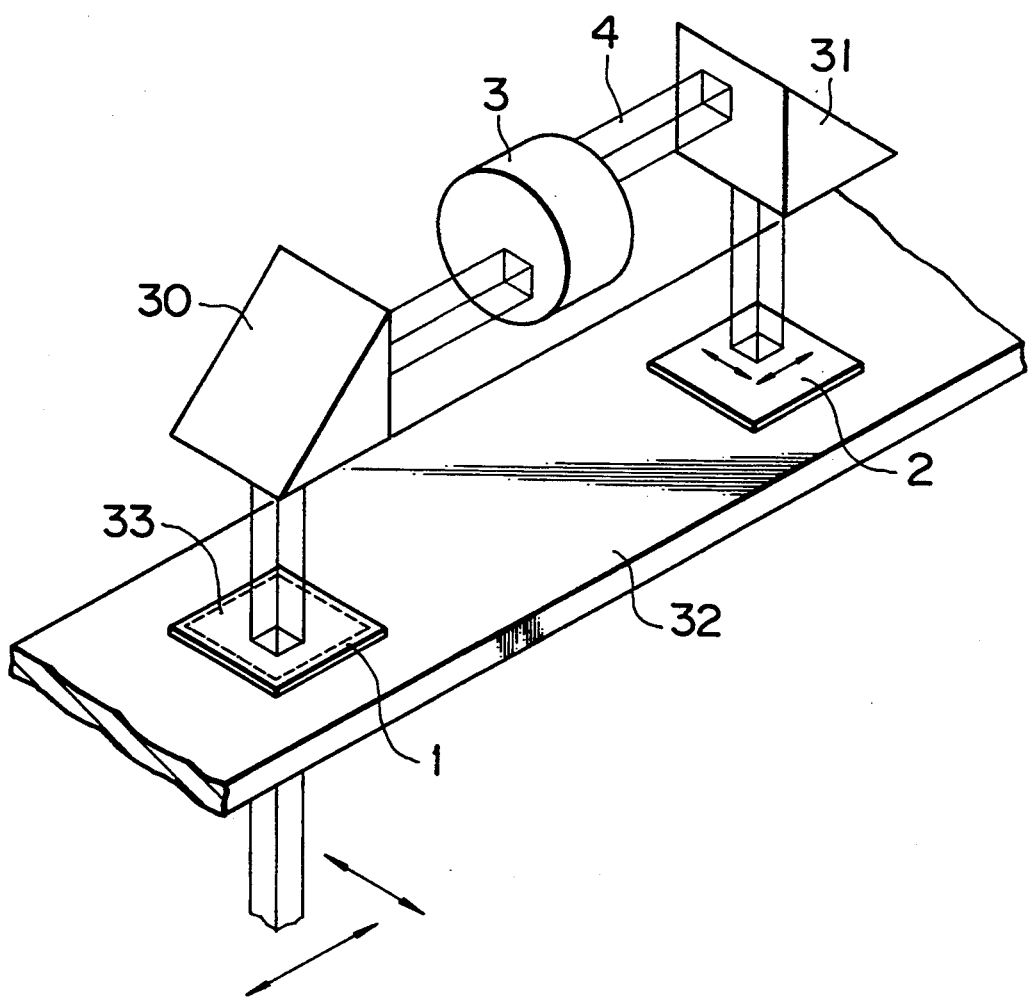
FIG. 9 is a diagram of a laser-machining optical apparatus in which a specimen and a mask are placed on the same plane.

FIG. 9 shows a laser-machining optical apparatus in which a specimen 2 and a mask 1 are mounted on a specimen table 32 to be placed on the same plane. This apparatus has an optical system for scanning the mask and the specimen on the same specimen table with a laser beam to work the specimen. Components 30 and 31 are rectangular prisms, and a component 33 is an aperture member provided on the specimen table 32. The laser beam can be moved to scan a pattern on the mask 1 and the specimen 2 as in the case of the above-described apparatuses to project an image of the pattern to the specimen 2. Specifically, in this embodiment, the mechanical structure of the apparatus is simplified since the mask and the specimen can be mounted on the same specimen table.

Each of the above-described embodiments is based on the method of performing scanning by moving a laser beam while fixing a mask and a specimen. Next, examples of an apparatus in which a mask and a specimen are integrally moved for scanning while a laser beam is fixed, and in which a working pattern formed on a surface of the mask is thereby projected to a surface of the specimen. Embodiments described below are applicable to the case of setting a projection magnification ratio of 1:1.

Figure 10:
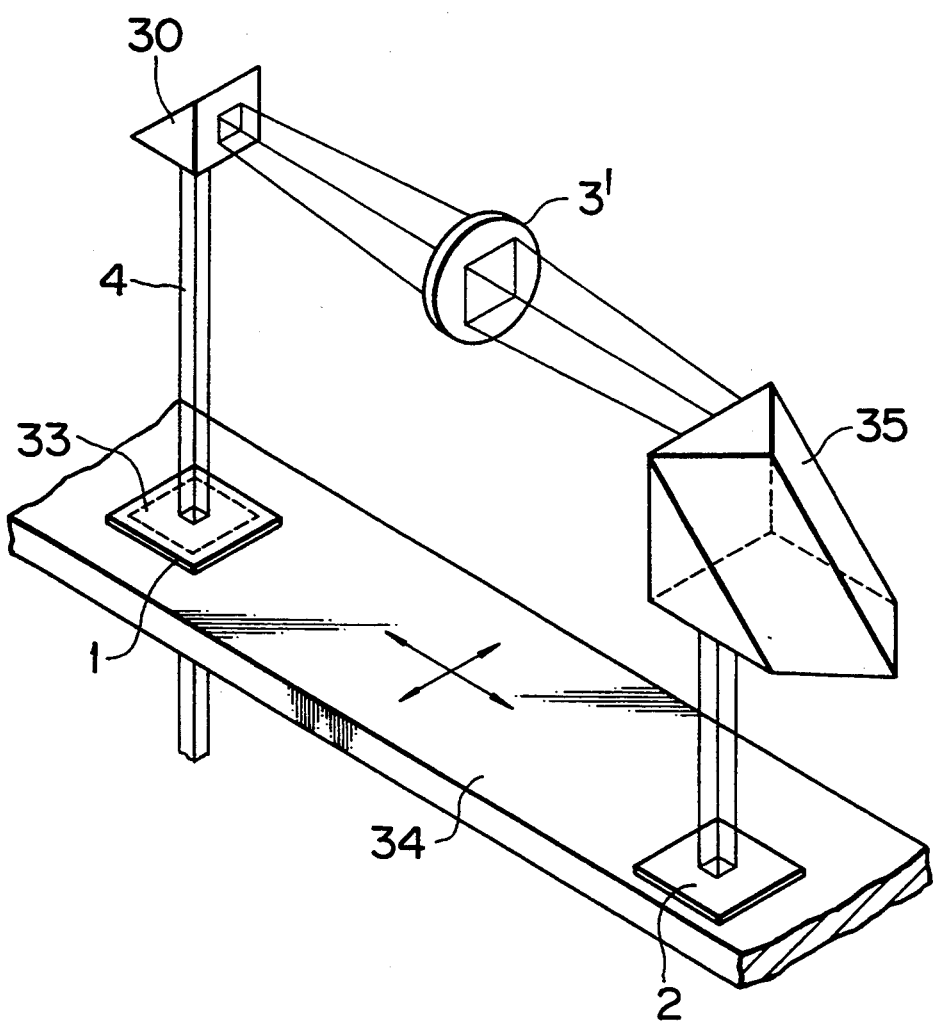
FIG. 10 is a diagram of a laser-machining optical apparatus using an Amici prism in a second direction-changing optical system.
Figure 11:
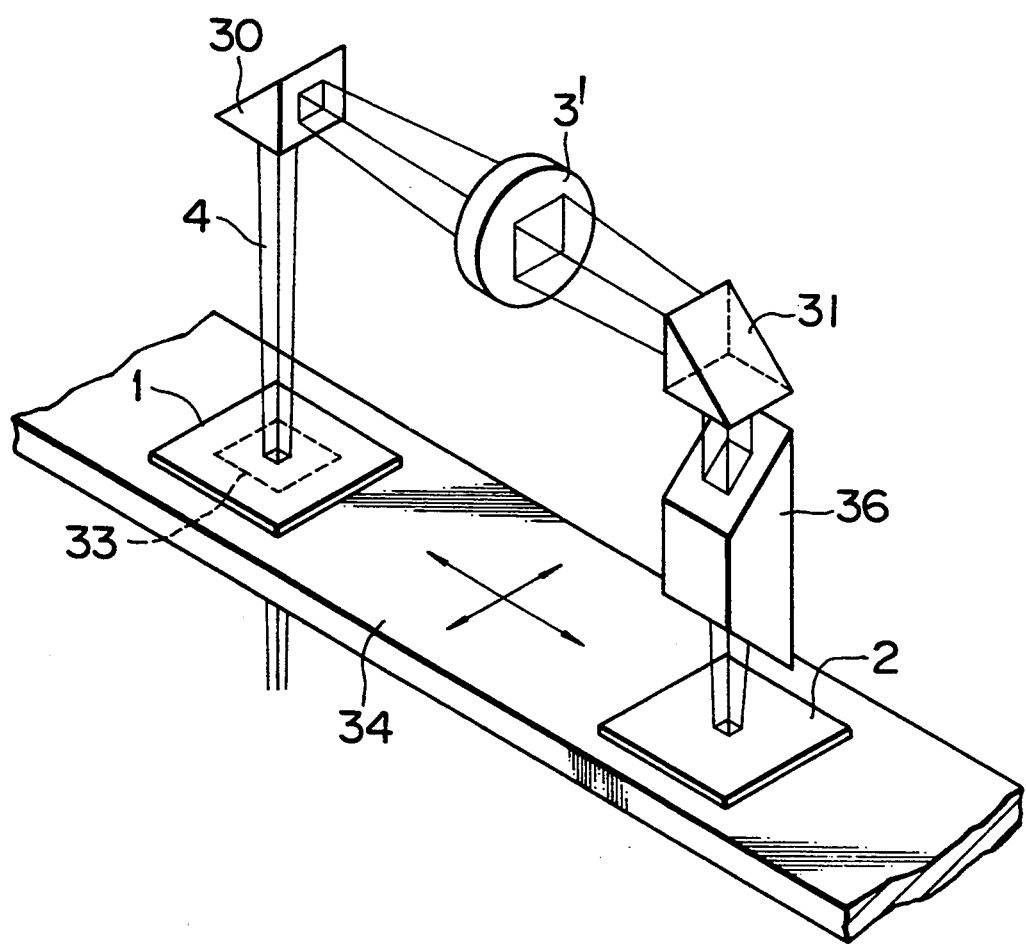
FIG. 11 is a diagram of a laser-machining optical apparatus using, in a second direction-changing optical system, a rectangular prism, and a Dove prism for correcting the image orientation.
Figure 12:
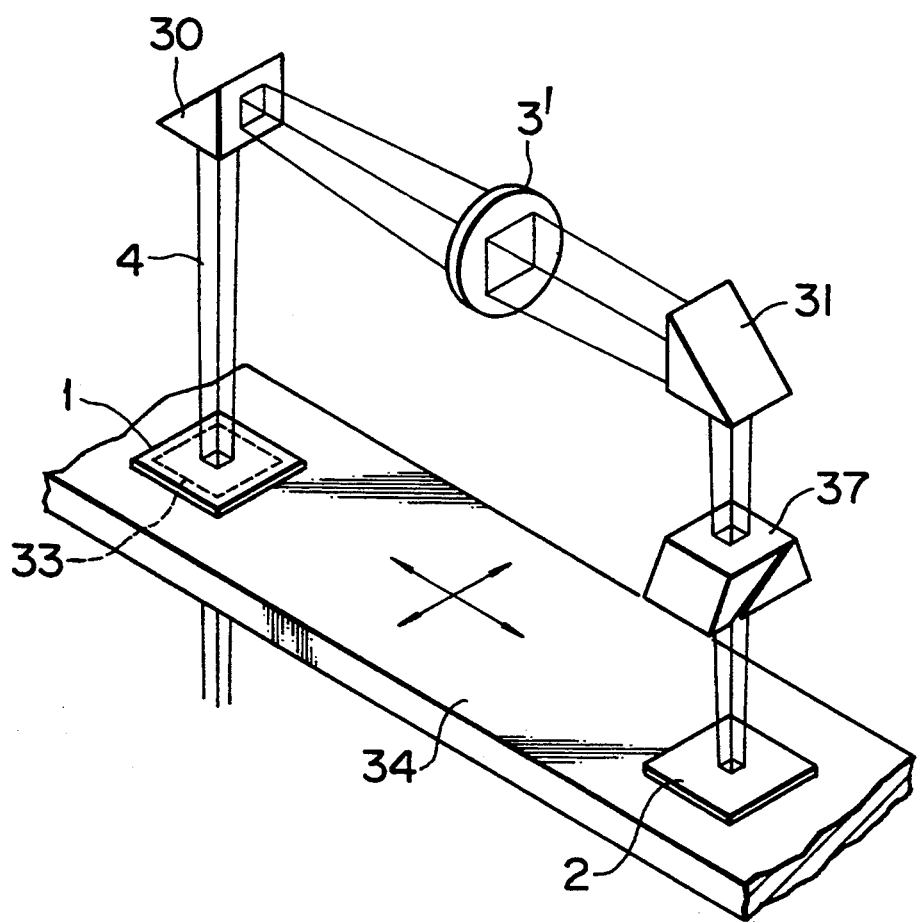
FIG. 12 is a diagram of a laser-machining optical apparatus using, in a second direction-changing optical system, a rectangular prism, and a Pechan prism for correcting the image orientation.

FIG. 10 shows an example in which an Amici prism 35 is adopted as an element in a second direction-changing optical system for enabling a laser beam passing through an objective 3' to be incident upon a specimen surface perpendicularly to the same. FIG. 11 shows an example in which a Dove prism 36 is used as an element in a second direction-changing optical system for rotating, through a rectangular prism 31, a laser beam passing through an objective 3' by 180° in one direction of a cross section of the laser beam, and FIG. 12 shows an example in which a Pechan prism having the same function. In the apparatuses shown in these figures, the object 3' is the same as the objective 3 shown in FIG. 1, a specimen table 34 is two-dimensionally movable along a plane corresponding its surface, and the Amici prism 35, the Dove prism 36 and the Pechan prism 37 are single or composite prisms.

In the example of using the Amici prism shown in FIG. 10, an image of a mask 1 mounted above an aperture 33 of the specimen table 34 is projected onto a specimen 2 placed on the same specimen table 34 by the objective 3'. To enable an incident laser beam 4 to reach the specimen 2 through the mask 1 in this system, the laser beam 4 must be flexed two times. By traveling of the laser beam 4 through the prism 30 and the objective 3', an inversion and rotation through 180° of the mask image are caused. The image thereby changed is corrected by the Amici prism 35 so that the image has the same orientation as the mask 1 and so that the laser beam 4 is led perpendicularly to the specimen surface. As the mask 1 and the specimen 2 are moved as a unit together with the specimen table 34, the image of the mask 1 is projected onto the specimen 2 at a magnification ratio of 1:1. According to this method, the aperture of the objective 3' can be reduced, and condensation of laser light 4 in the lens can be avoided since there is no need for a telecentric arrangement. The optical design is thereby made easier and the entire optical system can be simplified. To ensure the desired accuracy, the apparatus may be arranged so that the change in the relative position between the mask and the specimen when the specimen table 34 is moved is small, and so that the degree of uniformity of the speed at which the specimen table 34 is moved is high.

In the laser-machining optical apparatus shown in FIG. 11, the rectangular prism 31 and the Dove prism 36 for correcting the orientation of the image on the specimen surface are used in place of the Amici prism 35. This apparatus achieves the same effect as the laser-machining optical apparatus shown in FIG. 10.

In the laser-machining optical apparatus shown in FIG. 12, the Pechan prism 37 is used in place of the Dove prism 36. This apparatus achieves the same effect the laser-machining optical apparatuses shown in FIGS. 10 and 11.

Laser-machining optical apparatuses capable of integrally moving a mask and a specimen for scanning while fixing a laser beam to project a working pattern on a mask surface onto a specimen surface will be described below with reference to FIGS. 13 through 17.

In these figures, a component 38 is a specimen table on which a mask and a specimen are oppositely disposed parallel to each other, and which has a function of moving the mask and the specimen as a unit for scanning. FIGS. 13, 14, 15, 16, and 17 show examples in which a type II Porro prism 39, a type I Porro prism 40, a Hensolt prism 41, a Leman-Spenger prism 42, and an A-type Abbe prism 43 are used respectively.

These embodiments has a structure such that the mask 1 and the specimen 2 are oppositely disposed parallel to each other while being mounted on respective mount members, and an objective is provided therebetween. These embodiments are characterized in that a composite or single prism for correcting rotation of a mask image caused when a laser beam 4 passes through an objective 3' after passing through the mask 1 is provided after the objective 3'. These embodiments are also applicable to the case of setting a projection magnification ratio of 1:1.

Figure 13:
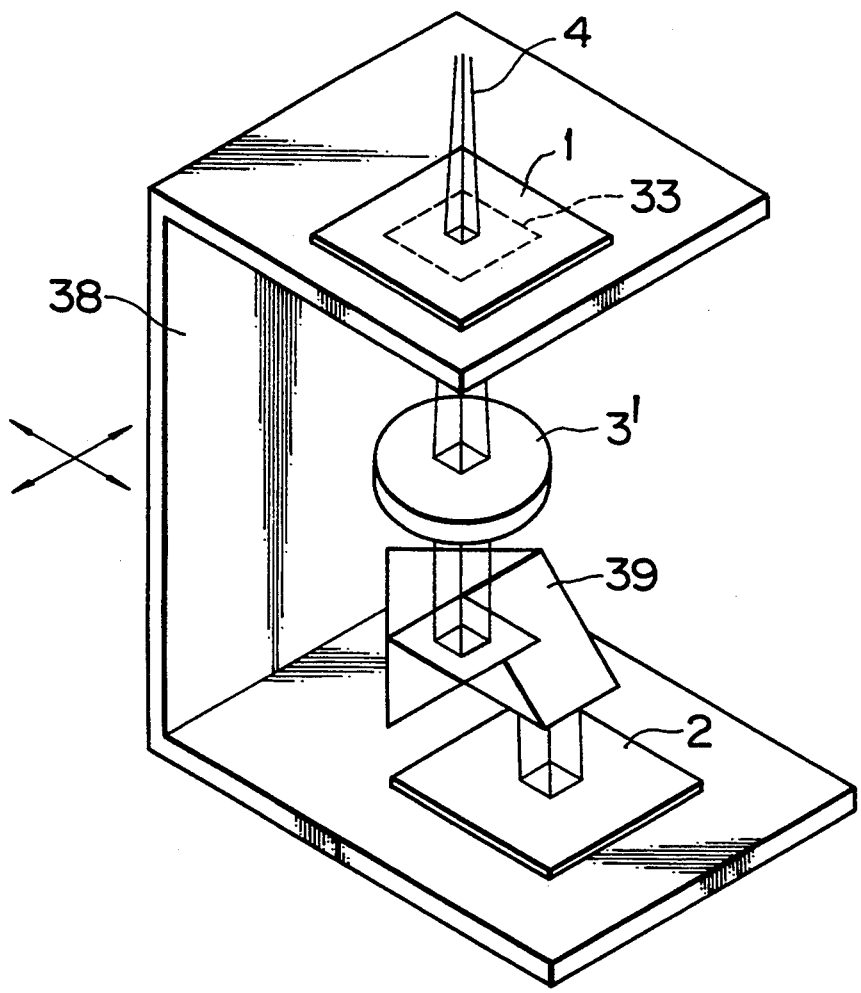
FIG. 13 is a diagram of a laser-machining optical apparatus in which a mask and a specimen are oppositely disposed parallel to each other, and which uses a type I Porro prism in a conversion optical system.
Figure 14:
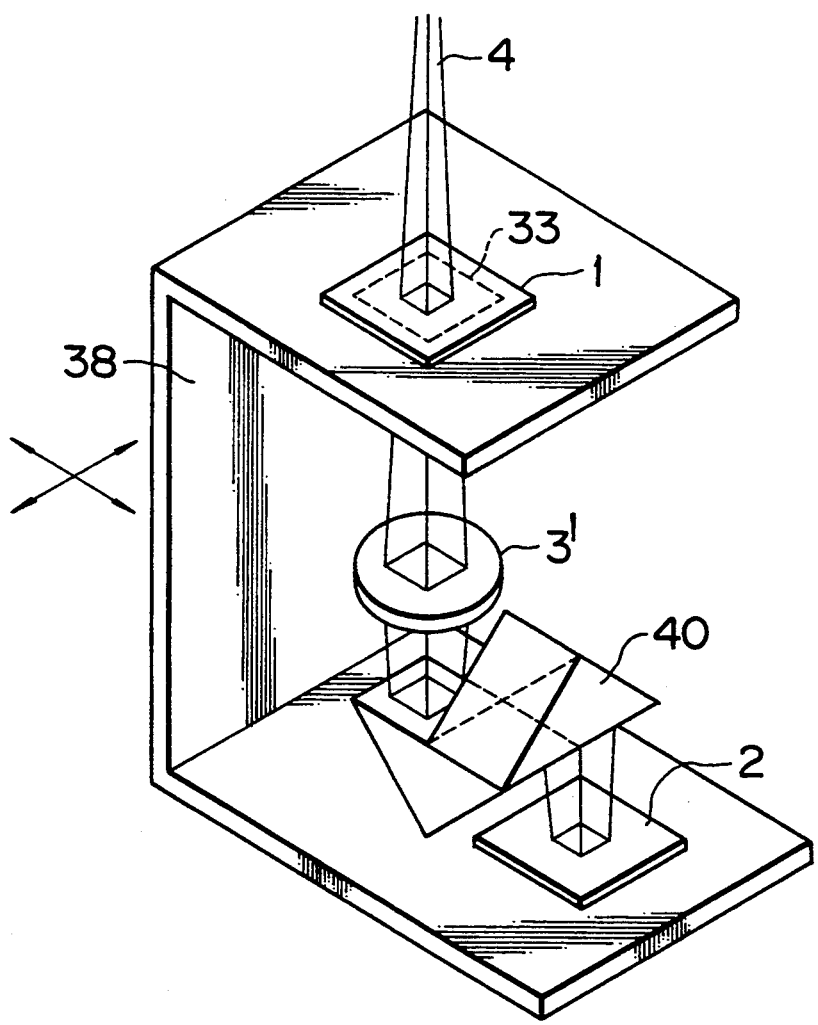
FIG. 14 is a diagram of a laser-machining optical apparatus in which a mask and a specimen are oppositely disposed parallel to each other, and which uses a type II Porro prism in a conversion optical system.
Figure 15:
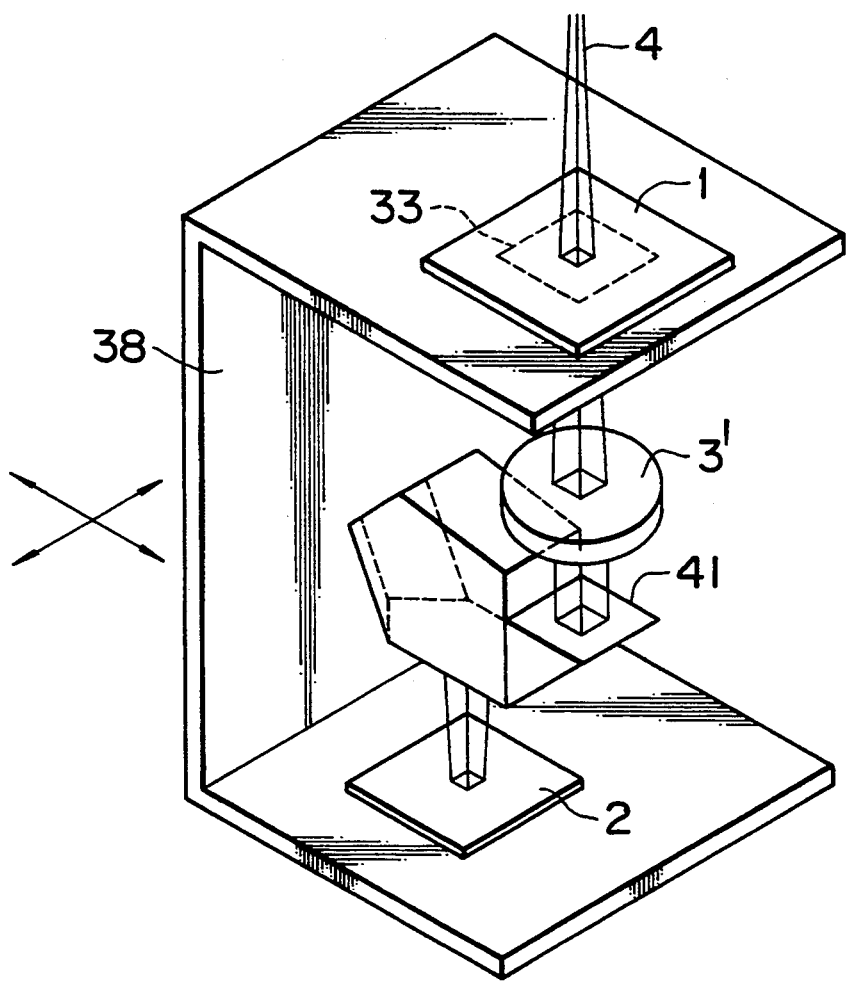
FIG. 15 is a diagram of a laser-machining optical apparatus in which a mask and a specimen are oppositely disposed parallel to each other, and which uses a Hensolt prism in a conversion optical system.
Figure 16:
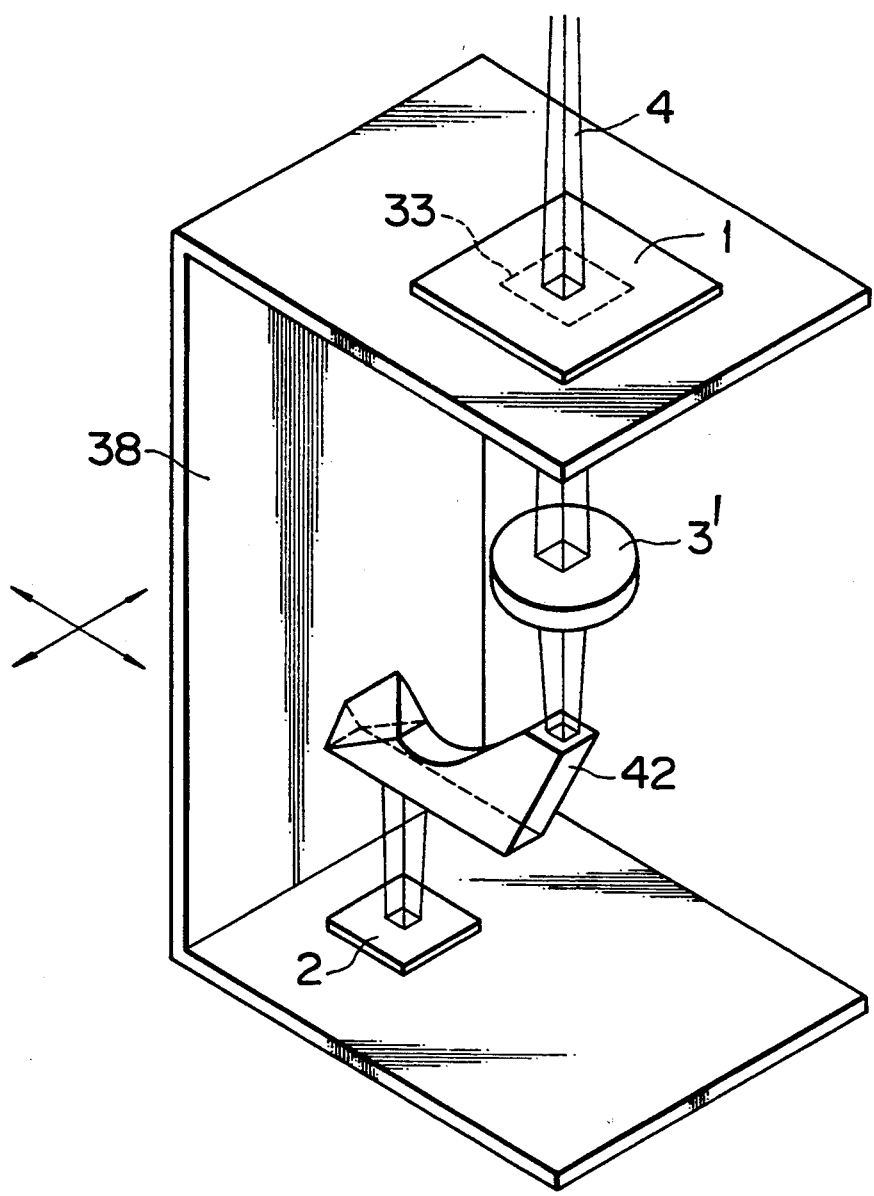
FIG. 16 is a diagram of a laser-machining optical apparatus in which a mask and a specimen are oppositely disposed parallel to each other, and which uses a Leman-Spenger prism in a conversion optical system.
Figure 17:
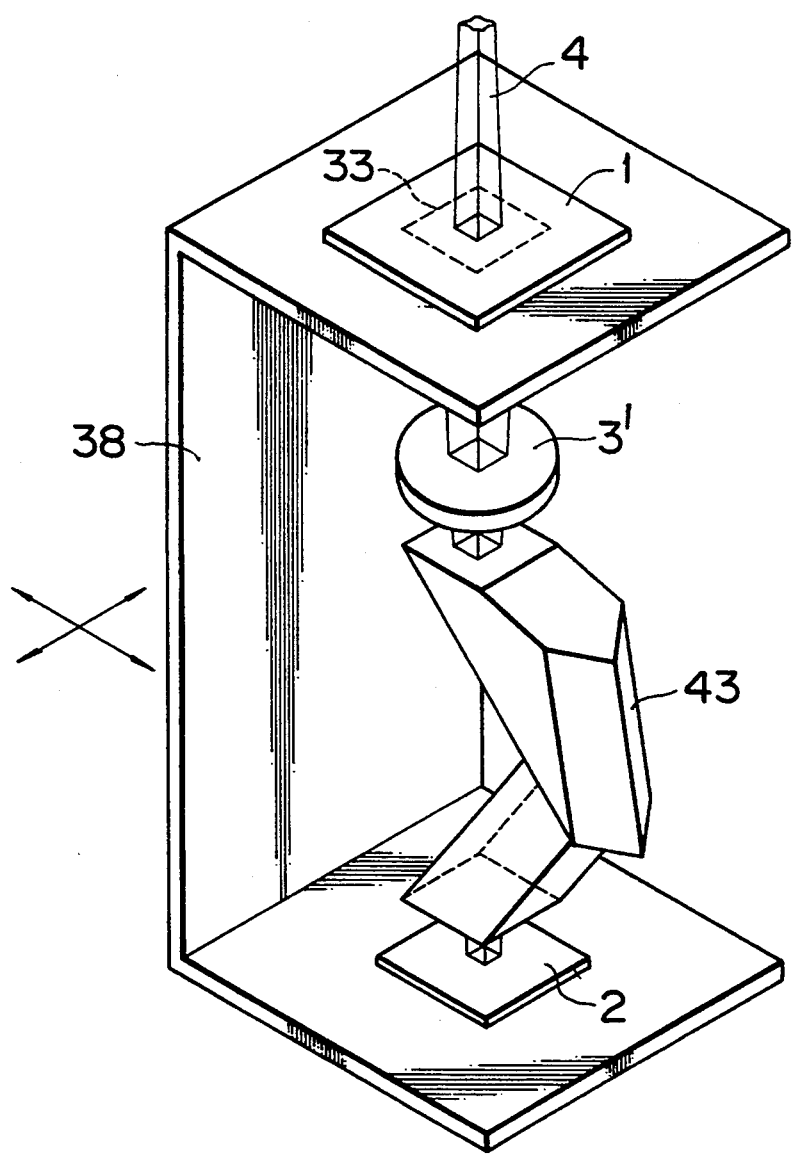
FIG. 17 is a diagram of a laser-machining optical apparatus in which a mask and a specimen are oppositely disposed parallel to each other, and which uses an A-type Abbe prism in a conversion optical system.

In the laser-machining optical apparatus shown in FIG. 13, the laser beam 4 passing through the mask 1 mounted above an aperture 33 of the specimen table 38 passes through the objective 3' and reaches the specimen 2, thereby projecting the image of the mask 1 to the specimen 2. To project the mask image of the same size to the specimen surface by moving the specimen table 38 for scanning, it is necessary that the orientation of the mask image formed on the specimen surface is the same of the original mask, as well as that the magnification ratio is 1:1. However, when the Laser beam 4 passes through the objective 3', the image is rotated through 180°. A composite or single prism is provided after the objective 3' as a means for correcting this rotation. In the embodiments illustrated in FIGS. 14 through 17, the above-mentioned various prisms are each used as the prism for correcting such rotation of the image, and the same correction effects can be achieved thereby.

In the examples of the laser-machining optical apparatuses shown in FIGS. 10 through 17, a prism for correcting an inversion or reversal of the image is placed after the objective. However, the same function can be achieved by providing such a prism before the objective.

It is apparent that a similar optical system can be formed by using, for example, a pentagonal prism in place of the rectangular prism 30 and by combining prisms of the various kinds mentioned above. However, it is advantageous, in terms of manufacturing of the desired optical apparatus, to form an optical system of simple optical parts such as ordinary rectangular prisms.

As described above, the laser-machining optical apparatus in accordance with the present invention, which works a surface of a specimen in accordance with a working pattern formed on a surface of a mask by projecting the working pattern to the specimen surface through an objective, is provided with a mechanism on which the mask and the specimen can be placed on the opposite sides of the objective so that an optical imaging relationship is maintained therebetween, and optical means for two-dimensionally scanning the mask surface with a beam of incident laser light. It is thereby possible to efficiently work the specimen by projecting the working pattern formed on the large-area mask to the specimen surface through the laser beam converted to have a small sectional area, while a lens and the mask are prevented from being damaged by high-energy density laser light. It is therefore possible to increase the range of application of laser machining conventionally used.

What is claimed is:

1. A laser-machining optical apparatus comprising:
   a laser head for oscillating laser light for working a specimen;
   a mask provided in the optical path of a beam of the laser light between the specimen and said laser head and having a working pattern formed on its surface;
   an objective provided in the optical path of the laser light beam between said mask and the specimen;
   a mechanism on which said mask and the specimen are placed so that an optical imaging relationship is maintained between the mask and the specimen with said objective interposed therebetween; and
   two-dimensional scanning means provided in the optical path of the laser light beam between said laser head and said mask to two-dimensionally scan the surface of said mask with the laser light beam from said laser head.

2. A laser-machining optical apparatus according to claim 1, further comprising:
   a condenser lens provided in the optical path of the laser light beam between said laser head and said mask to image the beam of laser light oscillated by said laser head on the mask surface;
   a reflecting optical element provided in the optical path of the laser light beam to two-dimensionally scan the mask surface with the laser light condensed by said condenser lens; and
   a correction optical system provided in the optical path of the laser light beam between said reflecting optical element and said mask to correct an inversion of a cross section of the laser light beam and a change in the optical path length caused in the process of changing the direction of the laser light beam by said reflecting optical element.

3. A laser-machining optical apparatus according to claim 1, wherein said two-dimensional scanning means comprises two rectangular prisms provided in the optical path of the laser light beam and arranged so as to be orthogonal to each other and so that their diagonal surfaces face each other.

4. A laser-machining optical apparatus according to claim 1, wherein the laser light beam is perpendicularly incident upon the mask surface, and said objective comprises a double telecentric objective forming an optical system for projecting the working pattern on the mask surface to the specimen surface through the laser light beam incident upon the mask, the laser light beam being incident upon said double telecentric objective in parallel with the optical axis of the same, the laser light beam being emergent from said double telecentric objective in parallel with the same optical axis after passing through said double telecentric objective.

5. A laser-machining optical apparatus according to claim 1, wherein the laser light beam is perpendicularly incident upon the mask surface; and said objective comprises a double telecentric objective forming an optical system for projecting the working pattern on the mask surface to the specimen surface through the laser light beam incident upon the mask, the laser light beam being incident upon said double telecentric objective in parallel with the optical axis of the same, the laser light beam being emergent from said double telecentric objective in parallel with the same optical axis after passing through said double telecentric objective; and said laser-machining optical apparatus further comprises an incident angle correction lens provided in the optical path of the laser light beam before said mask, said incident angle correction lens having a function of gradually increasing the angle of incidence of the laser beam upon said objective with respect to the laser beam position in the radial direction from a center of said objective toward the circumference of said objective.

6. A laser-machining optical apparatus according to claim 1, further comprising:
   a polyhedron prism having a plurality of surfaces formed at different angles such that a cross section of the laser light beam incident upon said polyhedron prism is divided into equal parts in vertical and horizontal directions to split the incident laser light beam into a plurality of beams of the same size at a position before the incidence of the laser light beam upon said mask, the angle of each of the surfaces of said polyhedron prism being selected so that the plurality of split beams are superposed on each other to form one beam on the optical path and are thereafter separated from each other again; and
   an optical system for enabling the plurality of split beams of the laser light separated again to be incident upon the mask surface at different incident angles and to be superposed on each other to form one beam at the mask surface;
   wherein an image of the mask corresponding to the portions of the incident laser light beams superposed at the mask surface is imaged on the specimen surface by said objective to work the specimen surface.

7. A laser-machining optical apparatus according to claim 1, wherein the laser light beam is shaped so as to have a square cross section;
   said laser-machining optical apparatus further comprising:
   a polyhedron prism having a plurality of surfaces formed at different angles such that a cross section of the laser light beam incident upon said polyhedron prism is divided into three parts in each of vertical and horizontal directions to split the incident laser beam into nine beams having the same cross sectional shape at a position before the incidence of the laser light beam upon said mask, the angle of each of the surfaces of said polyhedron prism being selected so that the split beams are superposed on each other to form one beam on the optical path and are thereafter separated from each other again; and an optical system for enabling the split beams of the laser light separated again to be incident upon the mask surface at different incident angles and to be superposed on each other to form one beam at the mask surface;

an image of the mask corresponding to the portions of the incident laser light beams superposed at the mask surface being imaged on the specimen surface by said objective to work the specimen surface.

8. A laser-machining optical apparatus according to claim 1, wherein the laser light beam is shaped so as to have a square cross section;

said laser-machining optical apparatus further comprising:

a polyhedron prism having at a rear end a plurality of surfaces formed at different angles such that a cross section of the laser light beam incident upon said polyhedron prism is divided into three parts in each of vertical and horizontal directions to split the incident laser light beam into nine beams having the same cross sectional shape at a position before the incidence of the laser light beam upon said mask, said polyhedron prism being formed of a number of blocks corresponding to the number of said plurality of surfaces, said blocks differing from each other in length and each square in cross section, said blocks being combined to form said surfaces of the polyhedron prism, the angle of each of said polyhedron prism being selected so that the split beams are superposed on each other to form one beam on the optical path and are thereafter separated from each other again; and an optical system for enabling the split beams of the laser light separated again to be incident upon the mask surface at different incident angles and to be superposed on each other to form one beam at the mask surface;

an image of the mask corresponding to the portions of the incident laser light beams superposed at the mask surface being imaged on the specimen surface by said objective to work the specimen surface.

9. A laser-machining optical apparatus according to claim 1, wherein the laser light beam is shaped so as to have a square cross section;

said laser-machining optical apparatus further comprising:

a polyhedron prism having at a rear end a plurality of surfaces formed at different angles such that a cross section of the laser light beam incident upon said polyhedron prism is divided into three parts in each of vertical and horizontal directions to split the incident laser light beam into nine beams having the same cross sectional shape at a position before the incidence of the laser light beam upon said mask, said polyhedron prism being formed of a number of blocks corresponding to the number of said plurality of surfaces, said blocks differing from each other in length and each square in cross section, said blocks being combined to form said surfaces of the polyhedron prism, the angle of each of said polyhedron prism being selected so that the split beams are superposed on each other to form one beam on the optical path and are thereafter separated from each other again; and an optical system for enabling the split beams of the laser light separated again to be incident upon the mask surface at different incident angles and to be superposed on each other to form one beam at the mask surface, a main beam among the split beams being incident upon said mask in parallel with the optical axis;

an image of the mask corresponding to the portions of the incident laser light beams superposed at the mask surface being imaged on the specimen surface by said objective to work the specimen surface.

10. A laser-machining optical apparatus comprising:

a laser head for oscillating laser light for working a specimen;

a mask provided in the optical path of a beam of the laser light between the specimen and said laser head and having a working pattern formed on its surface;

an objective provided in the optical path of the laser light beam between said mask and the specimen;

a first specimen table on which the specimen and said mask can be mounted in parallel with each other, an aperture greater than the area of the working pattern being formed in a portion of said first specimen table on which said mask is mounted;

a first direction-changing optical system for changing the direction of the laser light beam passing through the aperture of said specimen table perpendicularly to the working pattern;

an objective for projecting the working pattern on said mask to a surface of the specimen at a projection ratio of 1:1 after the passage of the laser light beam through said first direction-changing optical system;

a second direction-changing optical system for changing the direction of the laser light beam so that the laser light beam coming out from said objective is incident upon the surface of the specimen perpendicularly to the same; and two-dimensional scanning means for two-dimensionally scanning the entire area of the working pattern on said mask with the laser light beam.

11. A laser-machining optical apparatus according to claim 10, wherein said second direction-changing optical system changes the direction of the laser light beam so that the laser light beams coming out from said objective is incident perpendicularly to the specimen surface, and said second direction-changing optical system changes the orientation of an image of the working pattern projected to the specimen surface so that the orientation of the projected working pattern image coincides with the orientation of the original working pattern.

12. A laser-machining optical apparatus according to claim 10, wherein said second direction-changing optical system comprises a rectangular prism for changing the direction of the laser light beam so that the laser light beams emergent from said objective is incident perpendicularly to the specimen surface, and a Pechan prism for rotating a cross section of the laser light beam emergent from said rectangular prism through 180° in one direction.

13. A laser-machining optical apparatus according to claim 10, wherein said second direction-changing optical system comprises a rectangular prism for changing the direction of the laser light beam so that the laser light beams coming out from said objective is incident perpendicularly to the specimen surface, and an Amici prism for rotating a cross section of the laser light beam through 180° in one direction.

14. A laser-machining optical apparatus according to claim 10, wherein said second direction-changing optical system comprises a Dove prism which changes the direction of the laser light beam so that the laser light beams emergent from said objective is incident perpendicularly to the specimen surface, and which rotates a cross section of the laser light beam through 180° in one direction.

15. A laser-machining optical apparatus comprising:
a laser head for oscillating laser light for working a specimen;
a mask mount having an aperture through which a beam of the laser light passes, a mask mounted on the aperture of said mask and having a working pattern formed on its surface, and a second specimen mount disposed so as to oppose said mask and to be maintained at a distance from and in parallel with said mask;
an objective provided between said mask mount and said second specimen mount to project an image of the working pattern on said mask to a surface of the specimen through the laser light beam which has passed through the aperture of said mask;
a conversion optical system for correcting rotation of the image through 180° caused when the laser light beam passes through said objective so that the orientation of the image is the same as the orientation of the original working pattern on said mask; and
a driving system for integrally moving said mask and said second specimen mount along the surfaces thereof in a scanning manner.

16. A laser-machining optical apparatus according to claim 15, wherein said conversion optical system for correcting rotation of the image through 180° caused when the laser light beam passes through said objective comprises a type I Porro prism.

17. A laser-machining optical apparatus according to claim 15, wherein said conversion optical system for correcting rotation of the image through 180° caused when the laser light beam passes through said objective comprises a type II Porro prism.

18. A laser-machining optical apparatus according to claim 15, wherein said conversion optical system for correcting rotation of the image through 180° caused when the laser light beam passes through said objective comprises a Hensolt prism.

19. A laser-machining optical apparatus according to claim 15, wherein said conversion optical system for correcting rotation of the image through 180° caused when the laser light beam passes through said objective comprises a A-type Abbe prism.

20. A laser-machining optical apparatus according to claim 15, wherein said conversion optical system for correcting rotation of the image through 180° caused when the laser light beam passes through said objective comprises a Leman-Spenger prism.

21. A laser-machining optical apparatus according to claim 15, wherein said mask is formed of a synthetic silica, and the working pattern on the mask is formed of a reflecting dielectric.

22. A laser-machining optical apparatus according to claim 15, wherein said mask is formed of two synthetic silica plates maintained at a suitable distance from each other to enable a cooling gas to flow therebetween.

23. A laser-machining optical apparatus according to claim 15, wherein the laser light beam is excimer laser light having a wavelength of one of 308, 248 and 193 nm.

* * * * *